US010845427B2

(12) United States Patent
Scaletti et al.

(10) Patent No.: US 10,845,427 B2
(45) Date of Patent: Nov. 24, 2020

(54) METHOD FOR DETECTING EARTH-FAULT CONDITIONS IN A POWER CONVERSION APPARATUS

(71) Applicant: ABB Schweiz AG, Baden (CH)

(72) Inventors: Silvio Scaletti, Civitella in Val di Chiana (IT); Alessandro Guerriero, Paglieta (IT); Matteo Gargiulo, Terranuova Bracciolini (IT)

(73) Assignee: ABB Schweiz AG, Baden (CH)

( * ) Notice: Subject to any disclaimer, the term of this patent is extended or adjusted under 35 U.S.C. 154(b) by 134 days.

(21) Appl. No.: 16/242,563

(22) Filed: Jan. 8, 2019

(65) Prior Publication Data

US 2019/0212381 A1     Jul. 11, 2019

(30) Foreign Application Priority Data

Jan. 9, 2018   (EP) .................................. 18150887

(51) Int. Cl.
*G01R 31/02*     (2006.01)
*G01R 19/02*     (2006.01)
(Continued)

(52) U.S. Cl.
CPC .............. *G01R 31/50* (2020.01); *G01R 19/02* (2013.01); *G01R 19/2513* (2013.01);
(Continued)

(58) Field of Classification Search
CPC ........ G01R 31/00; G01R 31/28; G01R 31/50; G01R 31/52; G01R 19/00; G01R 19/0084;
(Continued)

(56) References Cited

U.S. PATENT DOCUMENTS 6,930,868 B2 * 8/2005 Kondo ................... H02H 3/337
361/42
9,696,743 B1 * 7/2017 Treichler .................. G05F 3/02
(Continued)

FOREIGN PATENT DOCUMENTS

| EP | 2306609 A2 | 4/2011 |
| EP | 2947468 A1 | 11/2015 |
| EP | 3128335 A1 | 2/2017 |

OTHER PUBLICATIONS

European Patent Office, Extended Search Report issued in corresponding Application No. 18150887.0, dated Jul. 11, 2018, 7 pp.

*Primary Examiner* — Hoai-An D. Nguyen
(74) *Attorney, Agent, or Firm* — Taft Stettinius & Hollister LLP; J. Bruce Schelkopf

(57) ABSTRACT

A method for detecting earth-fault conditions in a power conversion apparatus including the following steps: acquiring a first detection signal indicative of an earth-leakage current flowing between the power conversion apparatus and the ground; processing the first detection signal to calculate a first processing signal indicative of a time variant component of the earth-leakage current for one or more selected frequency bands of interest; processing the first detection signal to calculate a second processing signal indicative of a time-invariant component of the earth-leakage current; processing the first and second processing signals to calculate a third processing signal indicative of a resistive component of the earth-leakage current; and processing the third processing signal to determine whether earth-fault conditions are present.

20 Claims, 3 Drawing Sheets

(51) Int. Cl.
  *G01R 19/25* (2006.01)
  *H02J 3/38* (2006.01)
  *H02M 7/44* (2006.01)
  *G01R 31/50* (2020.01)
  *H02M 1/32* (2007.01)
  *H02H 3/347* (2006.01)
  *H02H 3/33* (2006.01)
  *H02M 1/00* (2006.01)
  *H02H 7/20* (2006.01)

(52) U.S. Cl.
  CPC .............. *H02H 3/33* (2013.01); *H02H 3/347* (2013.01); *H02J 3/383* (2013.01); *H02M 1/32* (2013.01); *H02M 7/44* (2013.01); *H02H 7/20* (2013.01); *H02M 2001/0009* (2013.01)

(58) Field of Classification Search
  CPC .. G01R 19/0092; G01R 19/02; G01R 19/165; G01R 19/16566; G01R 19/16571; G01R 19/25; G01R 19/2513; H02H 3/00; H02H 3/26; H02H 3/32; H02H 3/33; H02H 3/34; H02H 3/347; H02H 7/00; H02H 7/20; H02M 1/00; H02M 1/32; H02M 2001/0003; H02M 2001/0009; H02M 7/00; H02M 7/42; H02M 7/44
  USPC ....... 324/500, 509, 512, 522, 555, 600, 649, 324/691, 713, 715, 718; 340/500, 540, 340/635, 649, 650
  See application file for complete search history.

(56) References Cited

U.S. PATENT DOCUMENTS

| | | | |
|---|---|---|---|
| 10,352,985 B2* | 7/2019 | Ragaini | G01R 31/52 |
| 2013/0063842 A1* | 3/2013 | Kataoka | G01R 31/50 |
| | | | 361/42 |
| 2014/0239968 A1* | 8/2014 | Ishii | H02S 50/00 |
| | | | 324/509 |
| 2018/0316177 A1* | 11/2018 | Lee | H02H 3/02 |

* cited by examiner

METHOD FOR DETECTING EARTH-FAULT CONDITIONS IN A POWER CONVERSION APPARATUS

The present invention relates to the field of the electric power generation plants.

More particularly, the present invention relates to a method for detecting earth-fault conditions in a power conversion apparatus, e.g. a photovoltaic inverter.

As is known, electric power generation plants (e.g. photovoltaic plants) include a number (even hundreds or thousands) of power conversion apparatuses (e.g. power conversion apparatus) operatively associated to corresponding electric power generation systems (e.g. photovoltaic panels or photovoltaic strings).

In many applications, a power conversion apparatus comprises a DC section and an AC section electrically connected with a corresponding electric power generation system and with an electric power distribution grid by means of DC and AC electric buses, respectively.

Most traditional power conversion apparatuses have their DC and AC sections coupled and electrically insulated one from another by a voltage transformer.

Power conversion apparatuses of this type show relevant limitations in terms of efficiency due to power dissipation phenomena at the transformer windings. In addition, they are generally bulky and expensive to manufacture at industrial level.

In the last years, power conversion apparatuses of the transformer-less type have been developed. These devices do not include an insulating transformer stage to couple their DC and AC sections.

Power conversion apparatuses of the transformer-less type are becoming increasingly popular in the market as they are characterised by improved efficiency, reduced size and weight and lower industrial costs with respect to the above-mentioned most traditional devices.

However, these devices show some drawbacks in terms of electric safety as there is no electrical insulation between their DC and AC circuits and leakage currents towards earth, potentially dangerous to human health, may be present.

In order to mitigate these concerns, power conversion apparatuses of the transformer-less type are normally equipped with switching devices arranged to interrupt the electric lines of the AC electric bus upon receiving suitable trip commands.

When earth-fault conditions are determined, the above-mentioned switching devices trip and the power conversion apparatus (together with the electric power generation system electrically coupled thereto) becomes electrically segregated from the electric power distribution grid.

In power conversion apparatuses of the transformer-less type, earth-fault conditions are typically detected by measuring RMS (Root Mean Square) values of the earth-leakage current in the apparatus and checking the behavior of such an electrical quantity on the base of suitable identification criteria.

The experience has shown that this technical approach provides poor performances in terms of fault detection accuracy.

This circumstance often leads manufactures to set stringent identification criteria (protection threshold values) to determine the presence of earth-fault conditions in order to ensure a full compliance of the power conversion apparatuses with international regulations (e.g. UL1998, IEC 62109-2).

However, this remedy has proven to be at the origin of frequent undesired disconnections of the power conversion apparatuses from the electric power distribution grid with consequent reduction of the amount of electric energy delivered to the electric power distribution grid.

In the state of the art there, it is quite felt the need for solutions overcoming or mitigating the above-illustrated drawbacks of the state of the art.

The present invention intends to respond to this need by providing a method for detecting earth-fault conditions in a power conversion apparatus, according to the following claim 1 and the related dependent claims.

In a general definition, the method, according to the invention, comprises the following steps:
  acquiring a first detection signal indicative of an earth-leakage current flowing between said power conversion apparatus and the ground;
  processing said first detection signal to calculate a first processing signal indicative of a time-variant component of said earth-leakage current for one or more selected frequency bands of interest;
  processing said first detection signal to calculate a second processing signal indicative of a time-invariant component of said earth-leakage current;
  processing said first and second processing signals to calculate a third processing signal indicative of a resistive component of said earth-leakage current;
  processing said third processing signal to determine whether earth-fault conditions are present.

Preferably, said step of processing said first detection signal to calculate said first processing signal comprises filtering said first detection signal to calculate the AC harmonic content of said earth-leakage current filtered for said selected frequency bands of interest.

Preferably, said step of processing said first detection signal to calculate said second processing signal comprises filtering said first detection signal to calculate a DC harmonic content of said earth-leakage current.

According to an aspect of the invention, the calculation of said first processing signal includes the calculation of the average active power exchanged between the power conversion apparatus and the ground due to the presence of the earth-leakage current.

Preferably, said step of processing said first detection signal to calculate said first processing signal comprises the following steps:
  filtering said first detection signal to calculate a first preliminary processing signal indicative of the AC harmonic content of said earth-leakage current for said selected frequency bands of interest;
  acquiring a second detection signal indicative of an unbalance voltage between a component of said power conversion apparatus and the ground;
  filtering said second detection signal to obtain a second preliminary processing signal indicative of the AC harmonic content of said unbalance voltage for said selected frequency bands of interest;
  processing said first and second preliminary processing signals to calculate a third preliminary processing signal indicative of an average value of the active power exchanged between said power conversion apparatus and the ground due to the presence of said earth-leakage current, for said selected frequency bands of interest;
  processing said second preliminary processing signal to calculate a fourth preliminary processing signal indicative of RMS values of said second preliminary processing signal, in practice indicative of the AC-filtered unbalance voltage for said selected frequency bands of interest;

processing said third and fourth preliminary processing signals to calculate said first processing signal.

Preferably, said step of processing said first and second preliminary processing signals to calculate said third preliminary processing signal comprises the following steps:

processing said first and second preliminary processing signals to calculate a fifth preliminary processing signal indicative of an instantaneous value of the active power exchanged between said power conversion apparatus and the ground due to the presence of said earth-leakage current, for said one or more frequency bands of interest;

processing said fifth preliminary processing signal to calculate said third preliminary processing signal.

According to an aspect of the invention, said step of processing said first detection signal to calculate said second processing signal comprises the following steps:

filtering said first detection signal to calculate a sixth preliminary processing signal indicative of a DC harmonic content of said earth-leakage current;

processing said sixth preliminary processing signal to calculate said second processing signal.

Preferably, said step of processing said sixth preliminary processing signal includes the calculation of RMS values of said sixth preliminary processing signal, in practice of the DC-filtered earth-leakage current.

According to an aspect of the invention, said step of processing said third processing signal comprises comparing said third processing signal with one or more threshold values.

According to an aspect of the invention, the method comprises the following steps:

processing said first detection signal to calculate a fourth processing signal indicative of RMS values of said earth-leakage current;

processing said fourth processing signal and said third processing signal to calculate a fifth processing signal indicative of a capacitive component of said earth-leakage current.

In a further aspect, the present invention relates to a power conversion apparatus, according to the following claim 11 and the related dependent claims.

Preferably, said power conversion apparatus is a photovoltaic inverter, for example of the transformer-less type.

According to possible embodiments of the invention, said power conversion apparatus comprises a first control unit adapted to control the operation of a DC/DC conversion stage and a second control unit adapted to control the operation a DC/AC conversion stage.

Preferably, each of said first and second control units comprises corresponding data processing resources configured to execute the method of the invention method and generate corresponding trip signals for protection means included in or operatively associated with said power conversion apparatus, if earth-fault conditions are determined upon the execution of said method. Further features and advantages of the present invention will be apparent in the following description of non-limitative embodiments with reference to the figures in the accompanying drawings, in which.

Referring to the cited figures, the present invention relates to a method for detecting earth-fault conditions in a power conversion apparatus 100 for a low voltage electric power generation plant.

For the sake of clarity, it is specified that the term "low voltage" refers to operating voltages lower than 1 kV AC and 1.5 kV DC.

In principle, the power conversion apparatus 100 may be of any type.

The method of the invention, in fact, may be generally implemented in power conversion apparatuses of any type, e.g. in power conversion apparatuses designed for photovoltaic generation systems, wind generation systems, fuel cell generation systems, battery generation systems, and the like.

Anyway, the method of the invention is particularly adapted for implementation in photovoltaic inverters and it will be described in the following with particular reference of this application without intending to limit the scope of the invention in any way.

Thus, in a preferred implementation of the method 1, the power conversion apparatus 100 is a photovoltaic inverter.

Figure 1:
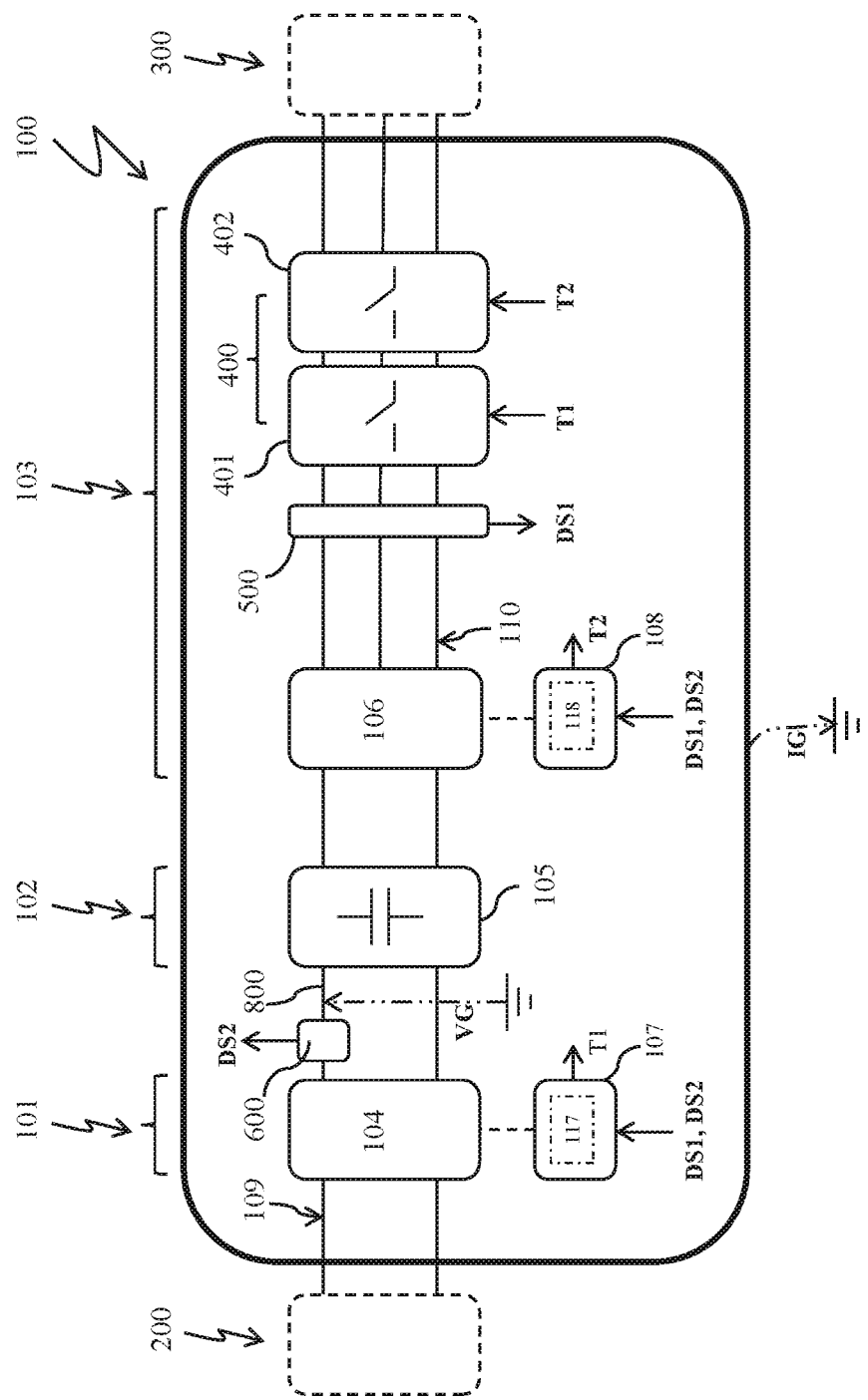
FIG. 1 shows a schematic block diagram of a power conversion apparatus implementing the method for detecting earth-fault conditions, according to the present invention.

With particular reference to FIG. 1, the power conversion apparatus 100 comprises a DC section 101, which is intended to be electrically connected with an electric power generation system 200 (e.g. an assembly including one or more photovoltaic panels or photovoltaic strings) through one or more DC electric lines arranged in a DC electric bus 109, and an AC section 103, which is intended to be electrically connected with an electric power distribution grid 300 (e.g. of single-phase or multi-phase type) through one or more AC electric lines arranged in a AC electric bus 110.

Preferably, the DC section 101 comprises a DC/DC conversion stage 104 (e.g. including a DC/DC switching converter) having an input port electrically connected with the DC electric bus 109.

Preferably, the AC section 103 comprises a DC/AC conversion stage 106 (e.g. including a DC/AC switching converter) having an output port electrically connected with the AC electric bus 110.

The power conversion apparatus 100 comprises a coupling section 102 to electrically couple the DC and AC sections 101, 103.

Preferably, the coupling section 102 comprises a DC-link stage 105 electrically coupling an output port of the DC/DC conversion stage 104 and an input port of the DC/AC conversion stage 106. As an example, the DC-link stage 105 may include one or more capacitors electrically connected in parallel between the output terminals of the DC/DC conversion stage 104 and the input terminals of the DC/AC conversion stage 106.

Preferably, the power conversion apparatus 100 is of the transformer-less type. In this case, it does not include any transformer (e.g. included in one or the sections 101, 102, 103) to electrically isolate the DC and AC sections 101, 103.

Preferably, the power conversion apparatus 100 comprises control means 107, 108 to control operation of the conversion stages 104, 106.

Preferably, the control means 107, 108 include data processing resources 117, 118 to carry out their functionalities.

The data processing resources 117, 118 may be industrially implemented in an analog and/or digital manner.

If they are implemented in analog manner, they comprise suitably arranged electronic circuits of analog type.

If they are implemented in a digital manner, they comprise suitably arranged computerized units (e.g. DSPs or microprocessors) configured to execute sets of software instructions stored or storable in a medium.

As a further alternative, the data processing resources 117, 118 may comprise integrated circuits or other electronic arrangements (e.g. FPGAs, SoCs, and the like) capable of processing analog and/or digital signals.

According to some embodiments of the invention, the above-mentioned control means comprise two distinct control units, namely a first control unit 107 included in the DC section 101 to control the conversion stage 104 and a second control unit 108 included in the AC section 103 to control the conversion stage 106.

According to some embodiments of the invention, the power conversion apparatus 100 comprises protection means 400 adapted to electrically disconnect said apparatus from the electric power distribution grid 300 upon receiving suitable trip signals T1, T2.

Preferably, the protection means 400 comprise one or more switching devices (e.g. of mechanical or electro-mechanical type such as relays, contactors or the like) operatively associated to the electric lines of the AC electric bus 110.

Preferably, the protection means 400 comprise a first group 401 and a second group 402 of switching devices, which can intervene independently one from the other upon receiving a first trip signal T1 and a second trip signal T2, respectively.

According to alternative embodiments of the invention, the protection means 400 are not included in the power conversion apparatus 100 but only operatively associated to this latter. In this case, they may be arranged along the electric lines electrically connecting the AC section 103 with the electric power distribution grid 300.

Preferably, the above-mentioned control means 107, 108 of the apparatus are configured to provide the trip signals T1, T2 to the groups 401, 402 of switching devices.

According to some embodiments of the invention, the power conversion apparatus 100 comprises first sensing means 500 adapted to provide a first detection signal DS1 indicative of an earth-leakage current IG flowing between the power conversion apparatus 10 and the ground.

Preferably, the first sensing means 500 comprise one or more current transformers or current sensors of different type arranged to detect an unbalance current between the electric lines of the electric bus 110.

According to alternative embodiments of the invention, the first sensing means 500 are not included in the power conversion apparatus 100 but only operatively associated to this latter. In this case, they may be arranged along the electric lines electrically connecting the AC section 103 with the electric power distribution grid 300.

Preferably, the above-mentioned control means 107, 108 of the apparatus are configured to receive and process the first detection signal DS1 delivered by the first sensing means 500.

According to preferred embodiments of the invention, the power conversion apparatus 100 comprises second sensing means 600 adapted to provide a second detection signal DS2 indicative of an unbalance voltage VG between a given component 800 of the power conversion apparatus 100 and the ground.

As an example, the component 800 of the power conversion apparatus 100 may be a conductor of the DC bus 100, a suitable terminal of the DC section or DC-link stage 105.

Preferably, the sensing means 600 comprise one or more resistive circuits or voltage sensors of different type arranged to detect a voltage difference between the component 800 of the power conversion apparatus 100 and the ground.

According to other embodiments of the invention, the second sensing means 600 are not included in the power conversion apparatus 100 but only operatively associated to this latter. In this case, they may be arranged between an external terminal of the power apparatus 100 and the ground.

Preferably, the above-mentioned control means 107, 108 of the apparatus are configured to receive and process the second detection signal DS2 delivered by the second sensing means 600.

In general, most of the components and circuits of the DC section 101, of the coupling section 102 and of the AC section 103 as well as the protection means 400 and the first and second sensing means 500, 600 may be of known type and will not be here described in further details for the sake of brevity.

Figure 2:
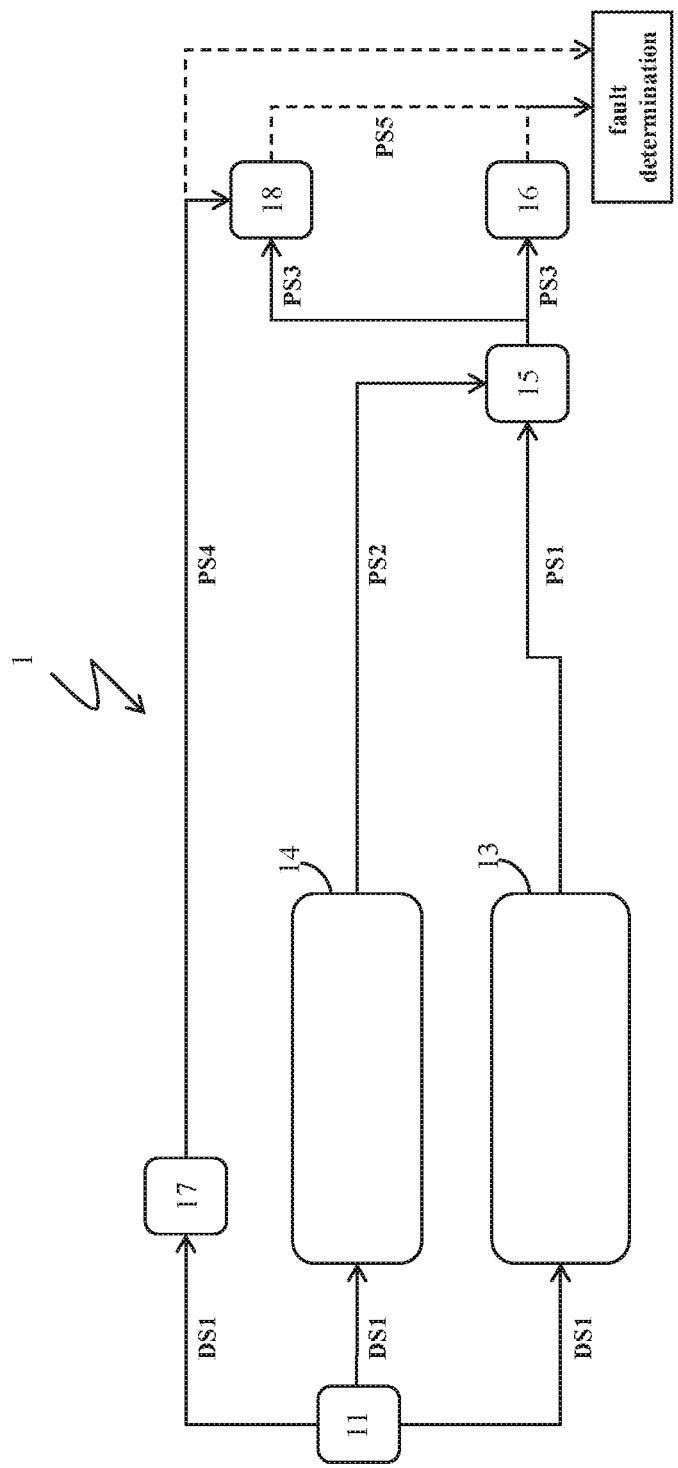
FIG. 2 shows a schematic block diagram describing the method, according to the present invention.
Figure 3:
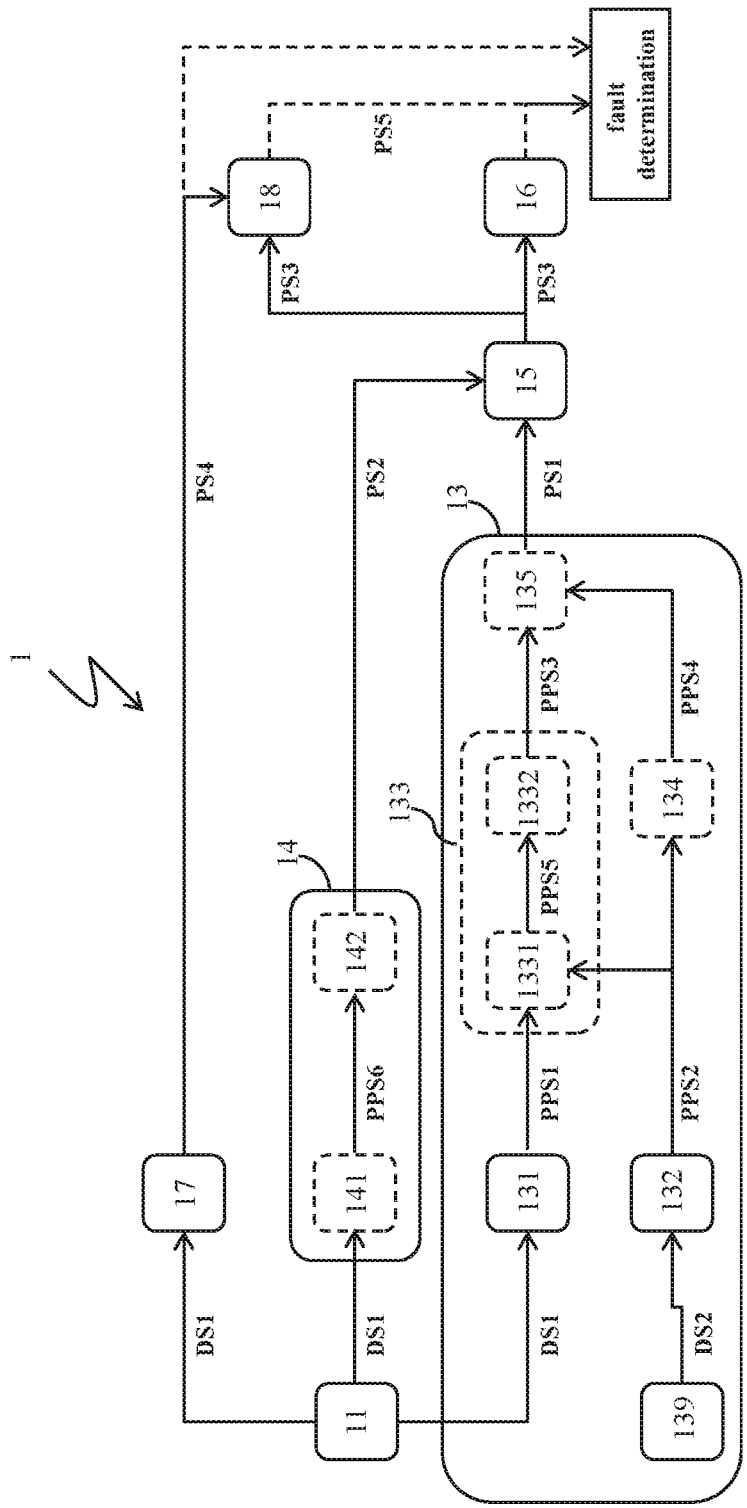
FIG. 3 shows a schematic block diagram describing a preferred embodiment of the method, according to the present invention.

With particular reference to FIGS. 2-3, the method 1, according to the invention, is now described.

The method 1 comprises a step 11 of acquiring a first detection signal DS1 indicative of an earth-leakage current IG flowing between the power conversion apparatus 100 and the ground.

As mentioned above, the first detection signal DS1 may be suitably provided by the first sensing means 500 included in or operatively associated with the power conversion apparatus 100.

According to the invention, the method 1 comprises the following further processing steps:

- a step 13 of processing the first detection signals DS1 so acquired to calculate a first processing signal PS1 indicative of a time-variant component $IG_{AC\text{-}BOI}$ of the earth-leakage current IG for one or more frequency bands of interest;
- a step 14 of processing the first detection signal DS1 to calculate a second processing signal PS2 indicative of a time-invariant component $IG_{DC}$ of the earth-leakage current IG;
- a step 15 of processing the third and second processing signals PS1, PS2 to calculate a third processing signal PS3 indicative of a resistive component $IG_{RES}$ of the earth-leakage current IG;
- a step 16 of processing the third processing signal PS3 to determine whether earth-fault conditions are present.

The above-mentioned processing step 13 is directed to calculate a signal PS1 indicative of a time-variant component $IG_{AC\text{-}BOI}$ of the detected earth-leakage current IG for one or more selected frequency bands of interest.

This solution finds its ground in the following considerations.

In a power conversion apparatus, the detected earth-leakage current IG may be generally considered as given by the following relation:

$$IG = IG_{AC} + IG_{DC}$$

where $IG_{AC}$ is the time-variant component of the earth-leakage current IG, which is indicative of the AC harmonic content of the earth-leakage current IG, and where $IG_{DC}$ is the time-invariant component of the earth-leakage current IG, which is indicative of the DC harmonic content of the earth-leakage current IG.

For the sake of clarity, the terms "time-invariant component" and "time-variant component" of the detected earth-leakage current IG respectively mean the DC component and the AC component of said current.

The above-mentioned time variant component $IG_{AC}$ of the earth-leakage current IG may be considered as given by the following relation:

$$IG_{AC}=IG_{AC\text{-}BOI}+IG_{AC\text{-}NS}$$

where $IG_{AC\text{-}NS}$ are high frequency AC components and/or noise components of the earth-leakage current IG that may be cut off as uninteresting for the purposes of detecting earth-fault conditions of the apparatus 100 and $IG_{AC\text{-}BOI}$ is a time-variant component $IG_{AC\text{-}BOI}$ of the earth-leakage current IG for one or more frequency bands of interest.

The frequency bands of interest for the time-variant component $IG_{AC\text{-}BOI}$ may be suitably selected depending on the circuital and functional characteristics of the electric power distribution grid 300 and the power conversion apparatus 100.

As an example, if the electric power distribution grid 300 is of the single-phase type (e.g. the power conversion apparatus 100 is a single-phase power conversion apparatus), the detection signal PS1 may be indicative of the time-variant component $IG_{AC}$ in frequency bands centered on the frequencies multiple of Fg (e.g. 2 Fg), where Fg is the grid frequency (e.g. 50 or 60 Hz).

As a further example, if the electric power distribution grid 300 is of the three-phase type (e.g. the power conversion apparatus 100 is a three-phase power conversion apparatus), the detection signal PS1 indicative of the time-variant component $IG_{AC}$ in a single frequency band centered on the frequency of 3 Fg.

This technical approach provides a high level of flexibility to the earth-fault determination process as the time-variant component $IG_{AC}$ may be properly tuned depending on the actual operative conditions of the actual power conversion apparatus 100.

Additionally, high frequency AC components and/or noise components $IG_{AC\text{-}NS}$ deriving from the actual operative conditions of the actual power conversion apparatus 100 may be effectively cut off.

In accordance with the above-illustrated reasoning, the above-mentioned processing step 13 to calculate the first processing signal PS1 preferably comprises filtering the first detection signal DS1 to calculate the AC harmonic content $IG_{AC\text{-}BOI}$ of the earth-leakage current IG for the selected frequency bands of interest.

Similarly, the above-mentioned step 14 of processing said first detection signal DS1 to calculate the second processing signal PS2 preferably comprises filtering the first detection signal DS1 to calculate a DC harmonic content $IG_{DC}$ of the earth-leakage current IG.

In a preferred embodiment of the invention, illustrated in FIG. 3, the above-mentioned time-variant component $IG_{AC\text{-}BOI}$ of the earth-leakage current IG is obtained by calculating, for the selected frequency bands of interest, the average active power $P_{A\text{-}BOI}$ exchanged between the power conversion apparatus 100 and the ground due to the presence of the earth-leakage current IG.

In other words, the time-variant component $IG_{AC\text{-}BOI}$ of the earth-leakage current IG is obtained by calculating, for the selected frequency bands of interest, the average active power of the AC electric disturbance represented by the earth-leakage current IG.

This solution finds its ground on the observation that the instantaneous active power $P_{AC\text{-}BOI}(t)$ of such said electric disturbance, for the selected frequency bands of interest, is generally given by the following relation:

$$P_{AC\text{-}BOI}(t)=VG_{AC\text{-}BOI}(t)*IG_{AC\text{-}BOI}(t)$$

where $VG_{AC\text{-}BOI}(t)$ and $IG_{AC\text{-}BOI}(t)$ are the instantaneous values of the time-variant components of the detected unbalance voltage VG and of the earth-leakage current IG filtered for the selected frequency bands of interest, respectively.

In practice, $VG_{AC\text{-}BOI}(t)$ and $IG_{AC\text{-}BOI}(t)$ represent the instantaneous values of the AC harmonic content of the unbalance voltage VG and of the earth-leakage current IG in the selected frequency bands of interest.

The average active power $P_A$ of said AC electric disturbance, for the selected frequency bands of interest, is generally given by the following relation:

$$P_{A\text{-}BOI} = \frac{1}{T}\int_0^T VG_{AC\text{-}BOI}(t) * IG_{AC\text{-}BOI}(t)dt$$

where T is a generic time interval, e.g. T=Tg=1/Fg (e.g. 20 or 16 ms).

The time-variant component $I_{AC\text{-}BOI}$ of the earth-leakage current IG, for the selected frequency bands of interest, is thus given by the following relation:

$$IG_{AC\text{-}BOI}=P_{A\text{-}BOI}/VG_{AC\text{-}BOI}$$

where $VG_{AC\text{-}BOI}$ is the time-variant component $VG_{AC\text{-}BOI}$ of the detected unbalance voltage VG.

In accordance with the above-illustrated reasoning, in this embodiment of the invention the above-mentioned processing step 13 preferably comprises:

the step 131 of filtering the first detection signal DS1 to calculate a first preliminary processing signal PPS1 indicative of the AC harmonic content $IG_{AC\text{-}BOI}$ of the earth-leakage current IG for the selected frequency bands of interest;

the step 139 of acquiring a second detection signal DS2 indicative of an unbalance voltage VG between a component of the power conversion apparatus 100 and the ground. As mentioned above, the detection signal DS2 may be suitably provided respectively by the second sensing means 600 conveniently included in or operatively associated with the power conversion apparatus 100 in this embodiment of the invention;

the step 132 of filtering the second detection signal DS2 to calculate a second preliminary processing signal PPS2 indicative of the AC harmonic content $VG_{AC\text{-}BOI}$ of the unbalance voltage VG for the selected frequency bands of interest.

In practice, for the selected frequency bands of interest, the first and second preliminary processing signals PPS1, PPS2 are indicative of the earth-leakage current IG and of unbalance voltage VG filtered for the selected frequency bands of interest, respectively.

In order to carry out the processing steps 131 and 132, band-pass filtering functions suitably tuned on the selected frequency bands of interest may be conveniently carried out by the above-mentioned data processing resources.

The above-mentioned processing step 13 preferably comprises the step 133 of processing the first and second preliminary processing signals PPS1, PPS2 to calculate a third preliminary processing signal PPS3 indicative of the average value $P_{A\text{-}BOI}$ of the active power exchanged between the power conversion apparatus 100 and the ground due to the presence of the earth-leakage current IG for said one or more frequency bands of interest.

Preferably, the above mentioned processing step 133 comprises a step 1331 of processing the first and second preliminary processing signals PPS1, PPS2 to calculate a third preliminary processing signal PPS3 indicative of the instantaneous value $P_{AC\text{-}BOI}(t)$ of the active power exchanged between the power conversion apparatus 100 and the ground for said one or more frequency bands of interest.

In order to carry out the processing step 1331, multiplication functions may be conveniently carried out by the above-mentioned data processing resources.

Preferably, the above-mentioned processing step 133 comprises a step 1332 of processing the fifth preliminary processing signal PPS5 to calculate the third preliminary processing signal PPS1.

Conveniently, the processing step 1332 includes the calculation of an average in time (e.g. in a time interval T=Tg=1/Fg) of the fifth preliminary processing signal PPS5. As an alternative, the processing step 1332 may include filtering the fifth preliminary processing signal PPS3 by means of a low pass filter.

In order to carry out the processing step 1332, integration functions may be conveniently carried out by the above-mentioned data processing resources.

According to this embodiment of the invention, the above-mentioned processing step 13 preferably comprises the step 134 of processing the second preliminary processing signal PPS2, which is indicative of the AC-filtered unbalance voltage VG for the selected frequency bands of interest, to calculate a fourth preliminary processing signal PPS4 indicative of RMS values of the filtered unbalance voltage VG.

Instant by instant, the RMS values of the AC-filtered unbalance voltage for the selected frequency bands of interest are given by the following relation:

$$VG_{AC\text{-}RMS\text{-}BOI}(t) = \sqrt{\frac{1}{T}\int_0^T |VG_{AC\text{-}BOI}(t)|^2 dt}$$

where $VG_{AC\text{-}BOI}(t)$ is the instantaneous values of the AC-filtered unbalance voltage VG.

In order to carry out the processing step 134, RMS calculation functions may be conveniently carried out by the above-mentioned data processing resources.

According to this embodiment of the invention, the above-mentioned processing step 13 preferably comprises the step 135 of processing the third preliminary processing signals PPS3, which is indicative of the average value $P_A$, and the fourth preliminary processing signal PPS4, which is indicative of the RMS values of the AC-filtered unbalance voltage VG, to calculate the first processing signal PS1, which is indicative of the time-variant component $IG_{AC}$. In order to carry out the processing step 135, division functions may be conveniently carried out by the above-mentioned data processing resources.

The processing step 14 of the method of the invention is directed to calculate a signal PS2 indicative of a time-invariant component $IG_{DC}$ of the detected earth-leakage current IG. Conveniently, this quantity is calculated by removing all the AC harmonic components from the detected earth-leakage current IG. In practice, the AC harmonic components of the detected earth-leakage current IG are treated as high frequency noise (FIGS. 2-3).

Preferably, the processing step 14 comprises the step 141 of filtering the first detection signal DS1 to calculate a sixth preliminary processing signal PPS6 indicative of a DC harmonic content of the earth-leakage current IG (DC-filtered earth-leakage current IG).

In order to carry out the processing step 141, low-pass filtering functions may be conveniently carried out by the above-mentioned data processing resources.

The above-mentioned processing step 14 then comprises the step 142 of processing the sixth preliminary processing signal PPS6, which is indicative of the DC-filtered earth-leakage current IG, to calculate the second processing signal PS2, which is indicative of a time-invariant component $IG_{DC}$ of the earth-leakage current IG.

Conveniently, the processing step 142 includes the calculation of the RMS values of the DC-filtered earth-leakage current IG, which may be given by a relation similar to the above-illustrated one.

In order to carry out the processing step 142, RMS calculation functions may be conveniently carried out by the above-mentioned data processing resources.

The processing step 15 of the method of the invention is directed to calculate the resistive component $IG_{RES}$ of the earth-leakage current IG.

This processing step finds its ground in the observation that, in a power conversion apparatus, an earth-leakage current IG may be considered as given by the following relation:

$$IG = IG_{RES} + IG_{CAP}$$

where $IG_{RES}$ is a resistive component of the earth-leakage current IG due to the presence of a resistive conductive path towards ground and potentially dangerous to human health and $IG_{CAP}$ is a capacitive component of the earth-leakage current IG generally due to the presence of parasitic capacitances (e.g. parasitic capacitances of the PV panels) and normally tolerated unless it reaches very high values higher than a maximum threshold limit.

The method of the invention allows achieving higher levels of accuracy in the earth-fault detection process, as spurious components of the earth-leakage current (from the electric safety point of view) are not taken into consideration unlike the traditional earth-fault detection methods.

In the method of the invention, in fact, the fault determination process is not generically based on the analysis of the RMS values of the earth-leakage current IG.

Instead, the resistive component $IG_{RES}$ of the earth-leakage current IG, which is the most relevant as it may be dangerous to human health, is measured and the behavior of this electrical quantity is checked on the base of suitable identification criteria to determine whether earth-fault conditions are present.

Preferably, the resistive component $IG_{RES}$ of the earth-leakage current IG is given by the following relation:

$$IG_{RES} = \sqrt{IG_{DC}^2 + IG_{AC\text{-}BOI}^2}$$

where $IG_{DC}$ is the time-invariant component of the earth-leakage current IG and $IG_{AC\text{-}BOI}$ is the time-variant component of the earth-leakage current IG for the selected frequency bands of interest.

The processing step 15 conveniently consists in processing the third and second processing signals PS1, PS2 according to the above-mentioned relation (FIGS. 2-3).

In order to carry out the processing step 15, a calculation function implementing the above-mentioned relation may be conveniently used.

The processing step 16 of the method of the invention is directed to process the third processing signal PS3, which is indicative of the resistive component $IG_{RES}$ of the earth-leakage current IG, to determine whether earth-fault conditions are present (FIGS. 2-3).

Preferably, the step 16 of processing the third processing signal PS3 includes a comparison of the third processing signal PS3 with one or more protection threshold values.

Said protection threshold values may be conveniently set to check the behavior of the third processing signal PS3 and of its derivatives in time.

Said protection threshold values may be predefined (e.g. stored in memory when the control means 107, 108 are configured) or run-time calculated depending on the operating condition of the power conversion apparatus 100.

According to an aspect of the invention, the method 1 comprises some processing steps directed to calculate the capacitive component of the earth-leakage current IG.

This information may be suitably processed to check the behavior of possible parasitic capacitances towards earth.

Preferably, the capacitive component $IG_{CAP}$ of the earth-leakage current IG is given by the following relation:

$$IG_{CAP} = \sqrt{IG^2 - IG_{RES}^2}$$

where $IG_{RES}$ is the resistive component of the earth-leakage current IG.

Preferably, the method 1 comprises a step 17 of processing the first detection signal DS1, which is indicative of the earth-leakage current IG, to calculate a fourth processing signal PS4 indicative of RMS values of said earth-leakage current (FIGS. 2-3).

In order to carry out the processing step 17, RMS calculation functions may be conveniently carried out by the above-mentioned data processing resources.

Preferably, the method 1 comprises a step 18 of processing the fourth processing signal PS4 and the third processing signal PS3 to calculate a fifth processing signal PS5 indicative of a capacitive component $IG_{CAP}$ of the earth-leakage current IG (FIGS. 2-3).

The processing step 18 conveniently consists in processing the third processing signal PS3 and the fourth processing signal PS4 according to the above-illustrated relation.

In order to carry out the processing step 18, a calculation function implementing the above-mentioned relation may be conveniently used.

Preferably, also the information brought by the processing signals PS4, PS5 may be used to implement or complete the above-illustrated step 16 directed to determine whether earth-fault conditions are present.

Preferably, in its practical implementation, the method 1 is particularly adapted for being executed by data-processing resources 117, 118 of the control means 107, 108 of the power conversion apparatus 100.

Preferably, said data processing resources are configured to execute the method 1 at regular time intervals (e.g. each grid period Tg=1/Fg) and provide trip signals T1, T2 for the protection means 400 to electrically disconnect the power conversion apparatus 100 from the electric power distribution grid 300, if they determine the presence of earth-fault conditions upon the execution of said method (FIG. 1).

Preferably, when said control means comprises two control units as illustrated above, each control unit 107, 108 of the power conversion apparatus 100 comprises data processing resources 117, 118 to execute the method 1.

Conveniently, each control unit 107, 108 is capable of executing the method 1 providing the trip signals T1, T2 autonomously, i.e. independently from the behaviour of the other control unit. Preferably, the data processing resources 117, 118 are also configured to provide trip signals T1, T2 for the protection means 400, if the presence of earth-fault conditions is determined upon the execution of said method.

The method for detecting earth-fault conditions in a power conversion apparatus, according to the present invention, provides several advantages with respect to the state of the art.

The method, according to the invention, provides high levels of accuracy in detecting earth-fault conditions both in test conditions (i.e. when the earth-leakage current IG is injected by a test device) and in normal operative conditions.

On one hand, this feature allows manufacturers to set-up optimal (i.e. not excessively stringent) fault identification criteria to comply with regulations with a consequent prolongation of the average service time of the power conversion apparatus as undesired disconnection events from the electric power distribution grid are less frequent.

On the other hand, a remarkable improvement of the overall control functionalities of the power conversion apparatus can be achieved.

The method, according to the invention, has a high level of flexibility in its practical implementation. Thus, it may be successfully used for earth-fault detection purposes in power conversion apparatuses having various configurations, e.g. in a single-phase power conversion apparatuses or three-phase power conversion apparatuses.

The method, according to the invention, is particularly useful in power conversion apparatuses of transformer-less type. However, it may be also implemented in most traditional power conversion apparatuses, even if these latter are typically less critical in relation to the above-illustrated electric safety concerns.

The method 1 is of relatively easy implementation at industrial level. As an example, it may be easily carried out by processing devices on board the power conversion apparatus, such as microcontrollers or DSPs.

The invention claimed is:

1. A method for detecting earth-fault conditions in a power conversion apparatus wherein it comprises the following steps:
    acquiring a first detection signal indicative of an earth-leakage current flowing between said power conversion apparatus and the ground;
    processing said first detection signal to calculate a first processing signal indicative of a time-variant component of said earth-leakage current for one or more selected frequency bands of interest;
    processing said first detection signal to calculate a second processing signal indicative of a time-invariant component of said earth-leakage current;
    processing said first and second processing signals to calculate a third processing signal indicative of a resistive component of said earth-leakage current;
    processing said third processing signal to determine whether earth-fault conditions are present.

2. The method, according to claim 1, wherein said step of processing said first detection signal to calculate said first processing signal comprises filtering said first detection signal to calculate the AC harmonic content of said earth-leakage current filtered for said selected frequency bands of interest.

3. The method, according to claim 1, wherein said step of processing said first detection signal to calculate said second processing signal comprises filtering said first detection signal to calculate a DC harmonic content of said earth-leakage current.

4. The method, according to claim 1, wherein said step of processing said first detection signals to calculate said first processing signal comprises the following steps:
- filtering said first detection signal to calculate a first preliminary processing signal indicative of the AC harmonic content of said earth-leakage current filtered for said selected frequency bands of interest;
- acquiring a second detection signal indicative of an unbalance voltage between a component of said power conversion apparatus and the ground;
- filtering said second detection signal to obtain a second preliminary processing signal indicative of the AC harmonic content of said unbalance voltage for said selected frequency bands of interest;
- processing said first and second preliminary processing signals to calculate a third preliminary processing signal indicative of an average value of the active power exchanged between said power conversion apparatus and the ground due to the presence of said earth-leakage current, for said selected frequency bands of interest;
- processing said second preliminary processing signal to calculate a fourth preliminary processing signal indicative of RMS values of said second preliminary processing signal;
- processing said third and fourth preliminary processing signals to calculate said first processing signal.

5. The method, according to claim 4, wherein said step of processing said first and second preliminary processing signals to calculate said third preliminary processing signal comprises the following steps:
- processing said first and second preliminary processing signals to calculate a fifth preliminary processing signal indicative of an instantaneous value of the active power exchanged between said power conversion apparatus and the ground due to the presence of said earth-leakage current, for said one or more frequency bands of interest;
- processing said fifth preliminary processing signal to calculate said third preliminary processing signal, said step of processing said fifth preliminary processing signal comprising calculating an average in time or carrying out a low-pass filtering of said fifth preliminary processing signal.

6. The method, according to claim 1, wherein said step of processing said first detection signal to calculate said second processing signal comprises the following steps:
- filtering said first detection signal to calculate a sixth preliminary processing signal indicative of a DC harmonic content of said earth-leakage current;
- processing said sixth preliminary processing signal to calculate said second processing signal, said step of processing said sixth preliminary processing signal comprising calculating RMS values of said sixth preliminary processing signal.

7. The method, according to claim 1, wherein said step of processing said third processing signal comprises comparing said third processing signal with one or more protection threshold values.

8. The method, according to claim 1, further comprising the following steps:
- processing said first detection signal to calculate a fourth processing signal indicative of RMS values of said earth-leakage current;
- processing said fourth processing signal and said third processing signal to calculate a fifth processing signal indicative of a capacitive component of said earth-leakage current.

9. The method, according to claim 1, wherein said power conversion apparatus is a photovoltaic inverter.

10. The method, according to claim 9, wherein said photovoltaic inverter is of the transformer-less type.

11. A power conversion apparatus electrically connectable with an electric power generation system and an electric power distribution grid comprising data processing resources configured to detect earth-fault conditions in the power conversion apparatus by:
- acquiring a first detection signal indicative of an earth-leakage current flowing between said power conversion apparatus and the ground;
- processing said first detection signal to calculate a first processing signal indicative of a time-variant component of said earth-leakage current for one or more selected frequency bands of interest;
- processing said first detection signal to calculate a second processing signal indicative of a time-invariant component of said earth-leakage current;
- processing said first and second processing signals to calculate a third processing signal indicative of a resistive component of said earth-leakage current;
- processing said third processing signal to determine whether earth-fault conditions are present.

12. The power conversion apparatus, according to claim 11, wherein it is a photovoltaic inverter.

13. The power conversion apparatus, according to claim 12, wherein said photovoltaic inverter is of the transformer-less type.

14. The method according to claim 2, wherein said step of processing said first detection signal to calculate said second processing signal comprises filtering said first detection signal to calculate a DC harmonic content of said earth-leakage current.

15. The method, according to claim 2, wherein said step of processing said first detection signals to calculate said first processing signal comprises the following steps:
- filtering said first detection signal to calculate a first preliminary processing signal indicative of the AC harmonic content of said earth-leakage current filtered for said selected frequency bands of interest;
- acquiring a second detection signal indicative of an unbalance voltage between a component of said power conversion apparatus and the ground;
- filtering said second detection signal to obtain a second preliminary processing signal indicative of the AC harmonic content of said unbalance voltage for said selected frequency bands of interest;
- processing said first and second preliminary processing signals to calculate a third preliminary processing signal indicative of an average value of the active power exchanged between said power conversion apparatus and the ground due to the presence of said earth-leakage current, for said selected frequency bands of interest;
- processing said second preliminary processing signal to calculate a fourth preliminary processing signal indicative of RMS values of said second preliminary processing signal;
- processing said third and fourth preliminary processing signals to calculate said first processing signal.

16. The method, according to claim 2, wherein said step of processing said first detection signals to calculate said first processing signal comprises the following steps:
- filtering said first detection signal to calculate a first preliminary processing signal indicative of the AC harmonic content of said earth-leakage current filtered for said selected frequency bands of interest;
- acquiring a second detection signal indicative of an unbalance voltage between a component of said power conversion apparatus and the ground;
- filtering said second detection signal to obtain a second preliminary processing signal indicative of the AC harmonic content of said unbalance voltage for said selected frequency bands of interest;
- processing said first and second preliminary processing signals to calculate a third preliminary processing signal indicative of an average value of the active power exchanged between said power conversion apparatus and the ground due to the presence of said earth-leakage current, for said selected frequency bands of interest;
- processing said second preliminary processing signal to calculate a fourth preliminary processing signal indicative of RMS values of said second preliminary processing signal;
- processing said third and fourth preliminary processing signals to calculate said first processing signal.

17. The method, according to claim 3, wherein said step of processing said first detection signals to calculate said first processing signal comprises the following steps:
- filtering said first detection signal to calculate a first preliminary processing signal indicative of the AC harmonic content of said earth-leakage current filtered for said selected frequency bands of interest;
- acquiring a second detection signal indicative of an unbalance voltage between a component of said power conversion apparatus and the ground;
- filtering said second detection signal to obtain a second preliminary processing signal indicative of the AC harmonic content of said unbalance voltage for said selected frequency bands of interest;
- processing said first and second preliminary processing signals to calculate a third preliminary processing signal indicative of an average value of the active power exchanged between said power conversion apparatus and the ground due to the presence of said earth-leakage current, for said selected frequency bands of interest;
- processing said second preliminary processing signal to calculate a fourth preliminary processing signal indicative of RMS values of said second preliminary processing signal;
- processing said third and fourth preliminary processing signals to calculate said first processing signal.

18. The method, according to claim 16, wherein said step of processing said first and second preliminary processing signals to calculate said third preliminary processing signal comprises the following steps:
- processing said first and second preliminary processing signals to calculate a fifth preliminary processing signal indicative of an instantaneous value of the active power exchanged between said power conversion apparatus and the ground due to the presence of said earth-leakage current, for said one or more frequency bands of interest;
- processing said fifth preliminary processing signal to calculate said third preliminary processing signal, said step of processing said fifth preliminary processing signal comprising calculating an average in time or carrying out a low-pass filtering of said fifth preliminary processing signal.

19. The method, according to claim 17, wherein said step of processing said first and second preliminary processing signals to calculate said third preliminary processing signal comprises the following steps:
- processing said first and second preliminary processing signals to calculate a fifth preliminary processing signal indicative of an instantaneous value of the active power exchanged between said power conversion apparatus and the ground due to the presence of said earth-leakage current, for said one or more frequency bands of interest;
- processing said fifth preliminary processing signal to calculate said third preliminary processing signal, said step of processing said fifth preliminary processing signal comprising calculating an average in time or carrying out a low-pass filtering of said fifth preliminary processing signal.

20. The method, according to claim 2, wherein said step of processing said first detection signal to calculate said second processing signal comprises the following steps:
- filtering said first detection signal to calculate a sixth preliminary processing signal indicative of a DC harmonic content of said earth-leakage current;
- processing said sixth preliminary processing signal to calculate said second processing signal, said step of processing said sixth preliminary processing signal comprising calculating RMS values of said sixth preliminary processing signal.

* * * * *